United States Patent
Osada et al.

(10) Patent No.: US 11,495,278 B2
(45) Date of Patent: Nov. 8, 2022

(54) MEMORY DEVICE

(71) Applicant: Kioxia Corporation, Tokyo (JP)

(72) Inventors: Yoshiaki Osada, Tokyo (JP); Kosuke Hatsuda, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/201,471

(22) Filed: Mar. 15, 2021

(65) Prior Publication Data
US 2021/0295888 A1 Sep. 23, 2021

(30) Foreign Application Priority Data
Mar. 19, 2020 (JP) .............................. JP2020-049110

(51) Int. Cl.
*G11C 11/16* (2006.01)
*H01L 27/22* (2006.01)

(52) U.S. Cl.
CPC ...... *G11C 11/1659* (2013.01); *G11C 11/1673* (2013.01); *G11C 11/1675* (2013.01); *H01L 27/222* (2013.01)

(58) Field of Classification Search
CPC ............ G11C 11/1659; G11C 11/1673; G11C 11/1675; G11C 11/1655; G11C 11/1657; G11C 11/1693; H01L 27/222; H01L 27/224; H01L 27/226
USPC .................................................. 365/158, 173
See application file for complete search history.

(56) References Cited

U.S. PATENT DOCUMENTS

| | | | | |
|---|---|---|---|---|
| 4,837,566 A | * | 6/1989 | Channing | ................ G09G 3/30 345/204 |
| 6,256,224 B1 | * | 7/2001 | Perner | ..................... G11C 11/16 365/171 |
| 6,882,565 B2 | | 4/2005 | Tsuchida | |
| 7,170,776 B2 | * | 1/2007 | Ooishi | ............... G11C 13/0004 365/158 |
| 9,009,009 B2 | * | 4/2015 | Oganov | ................. G06N 3/126 703/2 |
| 9,330,732 B2 | | 5/2016 | Hatsuda | |

(Continued)

FOREIGN PATENT DOCUMENTS

| | | |
|---|---|---|
| JP | 2002008368 A | 1/2002 |
| JP | 3836823 B2 | 10/2006 |

OTHER PUBLICATIONS

U.S. Appl. No. 16/821,510; First Named Inventor: Kosuke Hatsuda; Title: "Memory Device"; filed: Mar. 17, 2020.

(Continued)

*Primary Examiner* — Michael T Tran
(74) *Attorney, Agent, or Firm* — Holtz, Holtz & Volek PC

(57) ABSTRACT

According to one embodiment, a memory device includes first and second wiring lines, memory cells between first and second wiring lines, first and second common wiring lines, a first selecting circuit between one ends of the first wiring lines and the first common wiring line, and a second selecting circuit between the other ends of the first wiring lines and the first common wiring line. A path between the first wiring line and the first common wiring line through the first selecting circuit and a path between the first wiring line and the first common wiring line through the second selecting circuit are defined as first and second paths, one of the first and second paths is set to an electrically conductive state.

15 Claims, 16 Drawing Sheets

(56) References Cited

U.S. PATENT DOCUMENTS

| | | |
|---|---|---|
| 9,818,467 B2 | 11/2017 | Matsuoka et al. |
| 10,269,403 B2 | 4/2019 | Osada et al. |
| 10,311,931 B2 | 6/2019 | Matsuoka et al. |
| 10,388,345 B2 | 8/2019 | Hatsuda et al. |
| 10,431,277 B2 | 10/2019 | Hatsuda et al. |
| 10,535,391 B2 | 1/2020 | Osada et al. |
| 10,580,491 B2 | 3/2020 | Tiwari et al. |
| 2001/0048608 A1* | 12/2001 | Numata .............. G11C 11/1657 365/158 |
| 2005/0047205 A1 | 3/2005 | Tsuchida |
| 2006/0208977 A1* | 9/2006 | Kimura ................ G09G 3/30 345/76 |
| 2007/0268737 A1* | 11/2007 | Hidaka .............. G11C 11/1673 365/158 |
| 2009/0154225 A1* | 6/2009 | Hidaka .............. G11C 11/1657 365/158 |
| 2011/0233507 A1* | 9/2011 | Sonehara .............. H01L 45/12 257/E21.003 |
| 2012/0155146 A1* | 6/2012 | Ueda .................. G11C 11/1673 365/148 |
| 2012/0230090 A1* | 9/2012 | Takahashi .............. G11C 11/16 365/158 |
| 2012/0243303 A1* | 9/2012 | Shuto .................. G11C 11/1659 365/158 |
| 2014/0286085 A1* | 9/2014 | Miyakawa .......... G11C 11/1695 365/158 |
| 2015/0262626 A1* | 9/2015 | Hatsu .................. G11C 5/025 365/72 |
| 2016/0011947 A1 | 1/2016 | Matsuda |
| 2016/0064073 A1 | 3/2016 | Matsuoka et al. |
| 2016/0260466 A1* | 9/2016 | Katayama ............. G11C 11/161 |
| 2017/0062032 A1* | 3/2017 | Seo ......................... G11C 7/14 |
| 2017/0309321 A1 | 10/2017 | Chang et al. |
| 2019/0080772 A1* | 3/2019 | Yanagidaira ...... H01L 27/11519 |
| 2019/0295647 A1 | 9/2019 | Tiwari et al. |
| 2019/0371383 A1* | 12/2019 | Chiang .............. G11C 13/0026 |
| 2020/0302989 A1 | 9/2020 | Osada et al. |

OTHER PUBLICATIONS

U.S. Appl. No. 17/198,495; First Named Inventor: Kosuke Hatsuda; Title: "Variable Resistance Memory Device"; filed: Mar. 11, 2021.

* cited by examiner

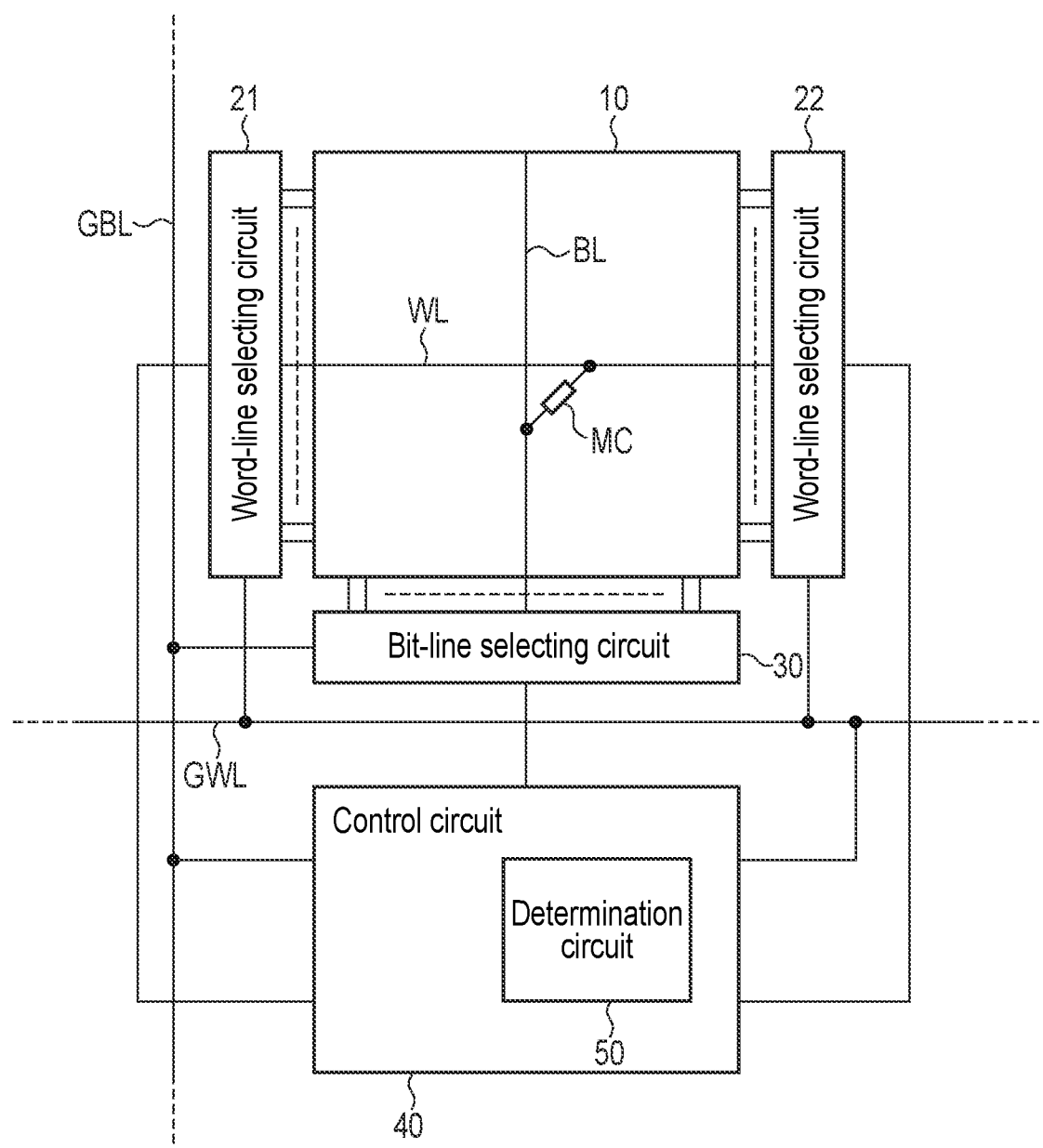
F I G. 1

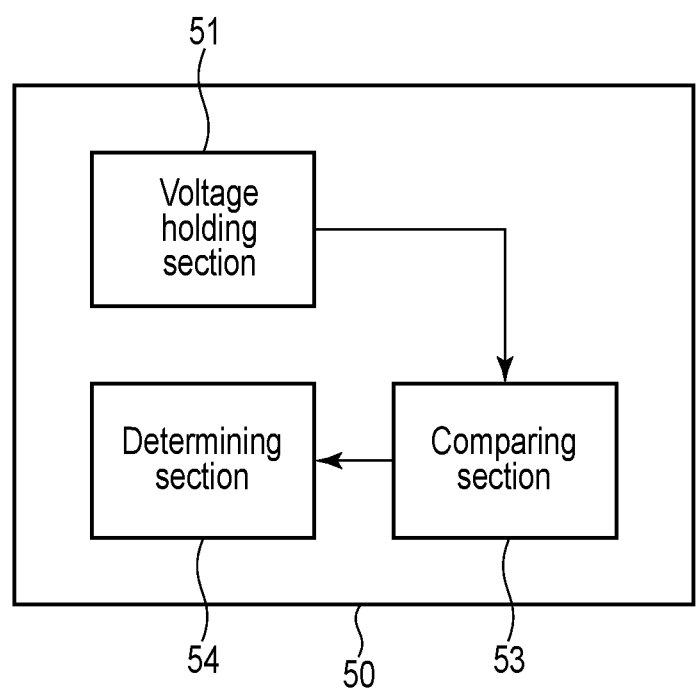
F I G. 19

MEMORY DEVICE

CROSS-REFERENCE TO RELATED APPLICATIONS

This application is based upon and claims the benefit of priority from Japanese Patent Application No. 2020-049110, filed Mar. 19, 2020, the entire contents of which are incorporated herein by reference.

FIELD

Embodiments described herein relate generally to a memory device.

BACKGROUND

A memory device in which a plurality of memory cells each including a resistance change memory element and switching element connected in series to each other are integrated on a semiconductor substrate is proposed.

BRIEF DESCRIPTION OF THE DRAWINGS

FIG. 1 is a view showing the overall configuration of a memory device according to an embodiment.

Each of FIG. 9A, FIG. 9B, FIG. 9C, FIG. 9D, FIG. 9E, FIG. 9F, FIG. 9G, FIG. 9H, FIG. 9I, FIG. 9J.

FIG. 19 is a block diagram showing the functional configuration of a determination circuit included in a memory device according to a modified example of the embodiment.

DETAILED DESCRIPTION

In general, according to one embodiment, a memory device includes: a plurality of first wiring lines each extending in a first direction; a plurality of second wiring lines each extending in a second direction intersecting the first direction; a plurality of memory cells each connected between a corresponding first wiring line and a corresponding second wiring line, and each including a resistance change memory element capable of being set a low-resistance state and a high-resistance state and a switching element connected in series to the resistance change memory element; a first common wiring line provided for the first wiring lines; a second common wiring line provided for the second wiring lines; a first selecting circuit interposed between one ends of the first wiring lines and the first common wiring line; and a second selecting circuit interposed between the other ends of the first wiring lines and the first common wiring line, wherein at a time of accessing a desired memory cell connected between a desired first wiring line and a desired second wiring line, when a path between the desired first wiring line and the first common wiring line through the first selecting circuit is defined as a first path, and a path between the desired first wiring line and the first common wiring line through the second selecting circuit is defined as a second path, during a first access period including a time point at which the switching element included in the desired memory cell makes a transition from an off-state to an on-state, one of the first path and the second path is set to an electrically conductive state and the other of the first path and the second path is set to an electrically nonconductive state.

Hereinafter, an embodiment will be described with reference to the accompanying drawings.

FIG. 1 is a view showing the fundamental configuration of a memory device according to the embodiment.

The memory device shown in FIG. 1 includes a memory cell array area 10, word-line selecting circuit (first selecting circuit) 21, word-line selecting circuit (second selecting circuit) 22, bit-line selecting circuit (third selecting circuit) 30, and control circuit 40.

Figure 2:
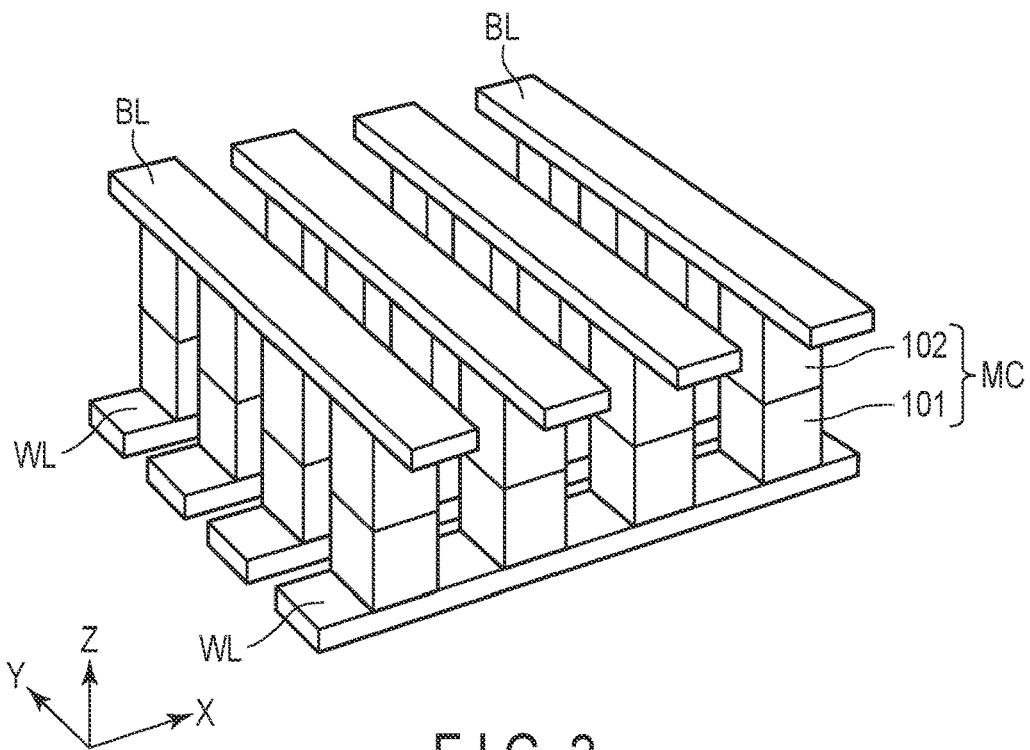
FIG. 2 is a perspective view schematically showing an example of the fundamental configuration of a memory cell array area included in the memory device according to the embodiment.

FIG. 2 is a perspective view schematically showing the fundamental configuration of the above-mentioned memory cell array area 10. It should be noted that the X-direction, Y-direction and Z-direction shown in FIG. 2 are orthogonal to each other.

In the memory cell array area 10, a plurality of memory cells MC, plurality of word lines (first wiring lines) WL, and plurality of bit lines (second wiring lines) BL are provided.

Each of the word lines WL extends in the X-direction (first direction) and each of the bit lines BL extends in the Y-direction (second direction) intersecting the X-direction.

Each of the memory cells MC is connected between a corresponding word line WL and corresponding bit line BL. Applying a predetermined voltage between a word line WL connected to a desired memory cell (memory cell which is an object to be selected) MC and bit line BL connected to the desired memory cell MC to thereby make a predetermined current flow through the desired memory cell MC makes it possible to carry out write/read to/from the desired memory cell. In each memory cell MC, a nonvolatile resistance change memory element to which a low-resistance state and high-resistance state (state where the resistance change memory element has a resistance value higher than the resistance value in the low-resistance state) can selectively be set, and two-terminal type switching element connected in series to the resistance change memory element are included. In this embodiment, as the nonvolatile resistance change memory element, a magnetoresistance effect element 101 is used and, as the two-terminal type switching element, a selector 102 is used.

Figure 3:
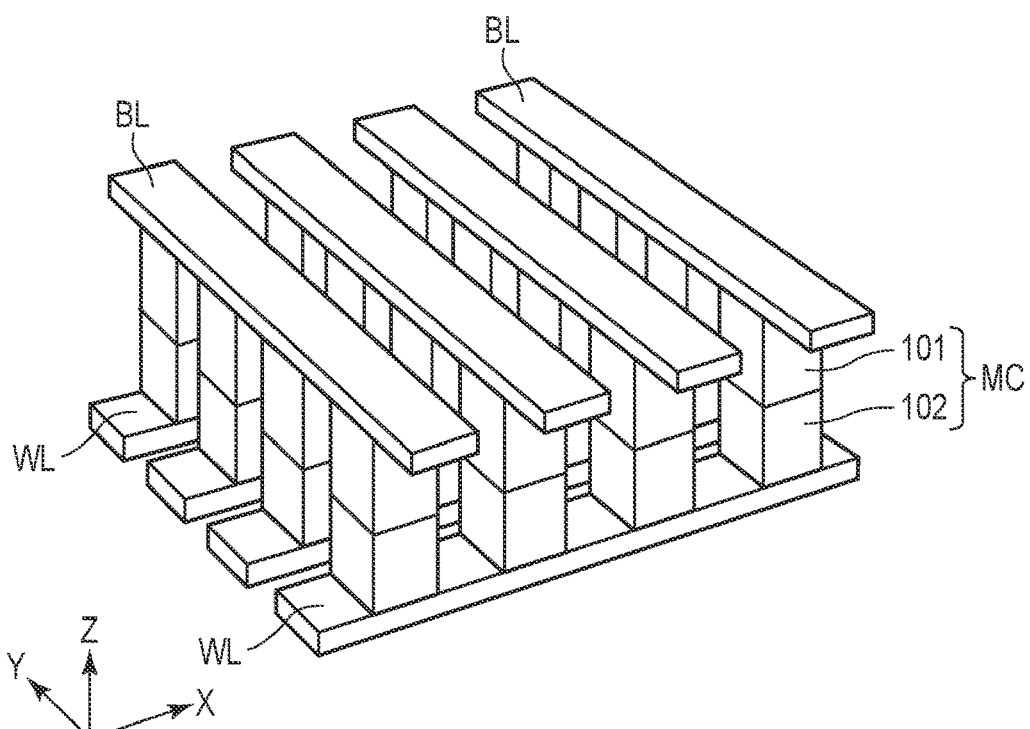
FIG. 3 is a perspective view schematically showing another example of the fundamental configuration of a memory cell array area included in the memory device according to the embodiment.

It should be noted that although in the example shown in FIG. 2, the selector 102 is provided on the upper-layer side of the magnetoresistance effect element 101, the selector 102 may also be provided on the lower-layer side of the magnetoresistance effect element 101 as shown in FIG. 3.

Further, although in the examples shown in FIG. 2 and FIG. 3, the bit lines BL are provided on the upper-layer side of the word lines WL, the bit lines BL may also be provided on the lower-layer side of the word lines WL.

Figure 4:
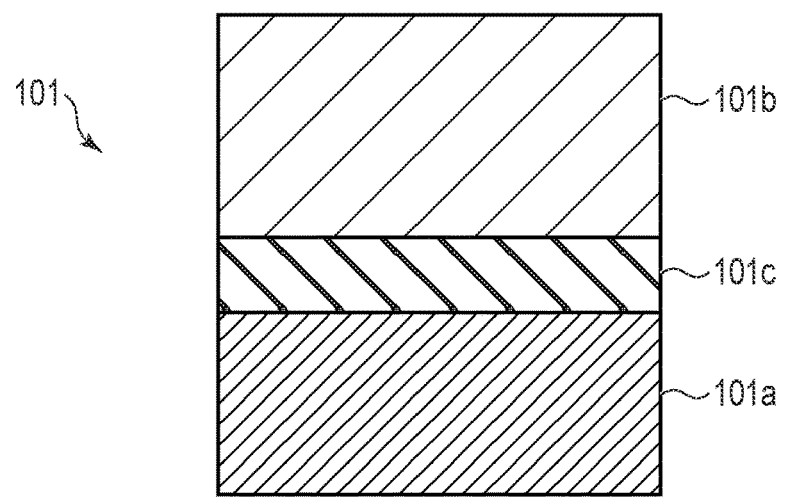
FIG. 4 is a cross-sectional view schematically showing a configuration example of a magnetoresistance effect element included in the memory device according to the embodiment.

FIG. 4 is a cross-sectional view schematically showing a configuration example of the magnetoresistance effect element (nonvolatile resistance change memory element) 101 included in the memory cell MC. As the magnetoresistance effect element, a Magnetic Tunnel Junction (MTJ) element is used.

As shown in FIG. 4, the magnetoresistance effect element 101 includes a storage layer (first magnetic layer) 101a, reference layer (second magnetic layer) 101b, and tunnel barrier layer (nonmagnetic layer) 101c provided between the storage layer 101a and reference layer 101b.

The storage layer 101a is formed of a ferromagnetic layer having a variable magnetization direction. The reference layer 101b is formed of a ferromagnetic layer having a fixed magnetization direction. The tunnel barrier layer 101c is a nonmagnetic layer formed of an insulating material. It should be noted that the variable magnetization direction implies a magnetization direction which changes with respect to a predetermined write current and, fixed magnetization direction implies a magnetization direction which does not change with respect to the predetermined write current.

When the magnetization direction of the storage layer 101a is parallel to the magnetization direction of the reference layer 101b, the magnetoresistance effect element 101 is in the low-resistance state and, when the magnetization direction of the storage layer 101a is antiparallel to the magnetization direction of the reference layer 101b, the magnetoresistance effect element 101 is in the high-resistance state. Accordingly, the magnetoresistance effect element 101 can store therein binary data according to the resistive state (low-resistance state, high-resistance state) thereof. Further, the resistive state (low-resistance state, high-resistance state) of the magnetoresistance effect element 101 can be set according to the direction of a write current flowing through the magnetoresistance effect element 101. That is, different resistive states are set to the magnetoresistance effect element 101 in both the case where the current flows from the storage layer 101a to the reference layer 101b, and case where the current flows from the reference layer 101b to the storage layer 101a.

It should be noted that although the example shown in FIG. 4 is a bottom-free type magnetoresistance effect element in which the storage layer 101a is positioned on the lower-layer side of the reference layer 101b, a top-free type magnetoresistance effect element in which the storage layer 101a is positioned on the upper-layer side of the reference layer 101b may also be used. Besides, in the magnetoresistance effect element 101, a shift cancelling layer for cancelling a magnetic field to be applied from the reference layer 101b to the storage layer 101a may further be provided.

Figure 5:
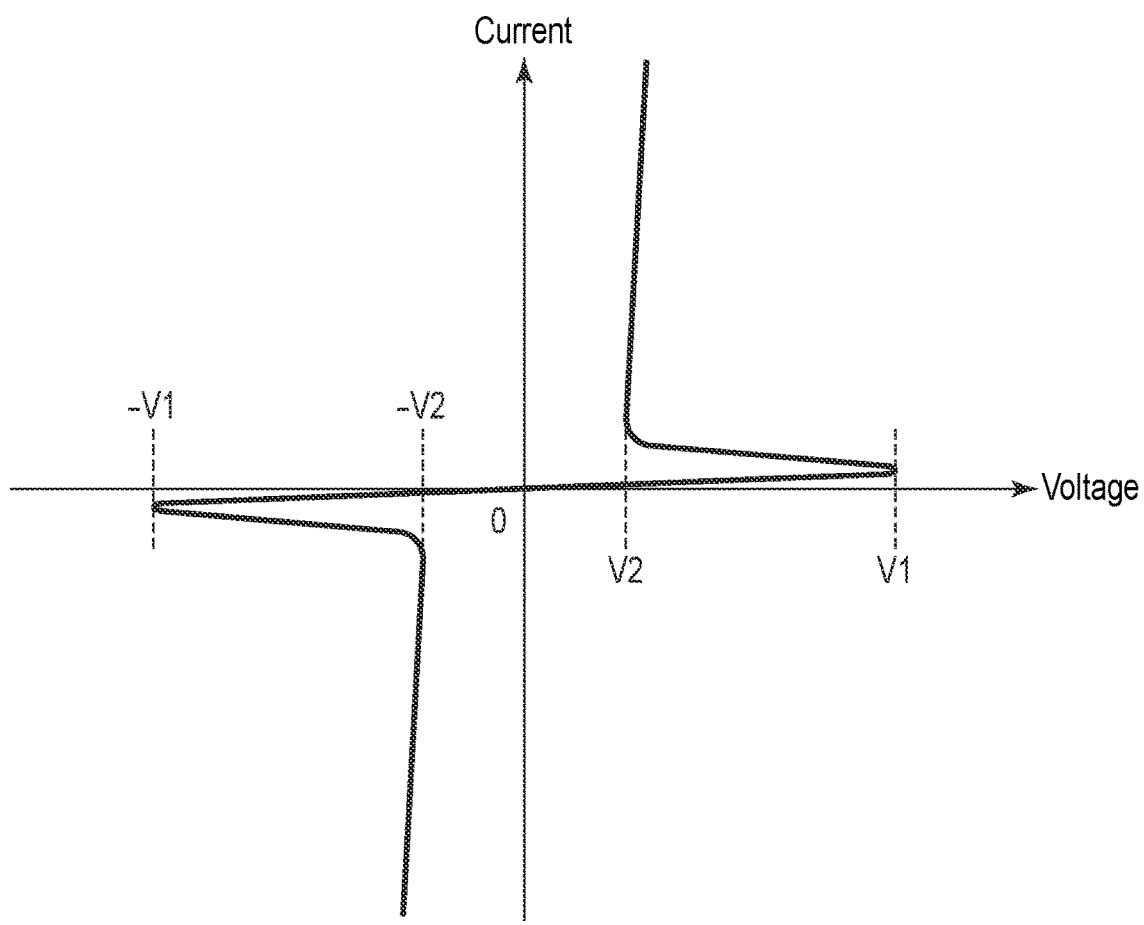
FIG. 5 is a view schematically showing the current-voltage characteristics of a selector included in the memory device according to the embodiment.

FIG. 5 is a view schematically showing the current-voltage characteristics of the selector (two-terminal type switching element) 102 included in the memory cell MC. As the material for the selector 102, for example, a material containing therein a chalcogen element can be used.

The selector 102 has nonlinear current-voltage characteristics. The selector 102 has the characteristics in which when a voltage applied between the two terminals thereof increases to reach a first voltage V1 (on-voltage), the selector 102 makes a transition from the off-state to the on-state and, when the selector 102 enters the on-state, the voltage between the two terminals shifts to a second voltage V2 lower than the first voltage V1 and the current abruptly increases. The selector further has the characteristics in which when the voltage applied between the two terminals thereof decreases to reach the second voltage V2 (off-voltage), the selector 102 makes a transition from the on-state to the off-state. Further, the selector 102 has the current-voltage characteristics symmetrical to each other in both the directions (positive direction and negative direction).

Applying a predetermined voltage between the word line WL and bit line BL to thereby set the selector 102 to the on-state makes it possible to carry out write/read to/from the magnetoresistance effect element 101.

Returning to the description of FIG. 1, each of the word-line selecting circuit (first selecting circuit) 21 and word-line selecting circuit (second selecting circuit) 22 is a circuit configured to select a desired word line (word line which becomes the object to be selected) WL connected to a desired memory cell (memory cell which becomes the object to be selected) MC. As will be described later, each of the word-line selecting circuits 21 and 22 includes a plurality of switches and has a function of electrically connecting a global word line (first common wiring line) GWL and desired word line (desired local word line) WL to each other. More specifically, bringing the switch connected to the desired word line WL to the on-state makes it possible to electrically connect the global word line GWL and desired word line WL to each other.

The bit-line selecting circuit (third selecting circuit) 30 is a circuit configured to select a desired bit line (bit line which becomes the object to be selected) BL connected to a desired memory cell MC. The bit line selecting circuit 30 includes a plurality of switches, and has a function of electrically connecting a global bit line (second common wiring line) GBL and desired bit line (desired local bit line) BL to each other. More specifically, bringing the switch connected to the desired bit line BL to the on-state makes it possible to electrically connect the global bit line GBL and desired bit line BL to each other.

Applying a voltage between a desired word line (word line which becomes the object to be selected) WL and desired bit line (bit line which becomes the object to be selected) BL to thereby make a predetermined current flow between the word line WL and bit line BL makes it possible to carry out write/read to/from the desired memory cell (memory cell which becomes the object to be selected) MC.

The control circuit 40 is a circuit configured to carry out various control items including control of the word-line selecting circuit 21, word-line selecting circuit 22, and bit-line selecting circuit 30, and includes a determination circuit 50 to be described later.

Figure 6:
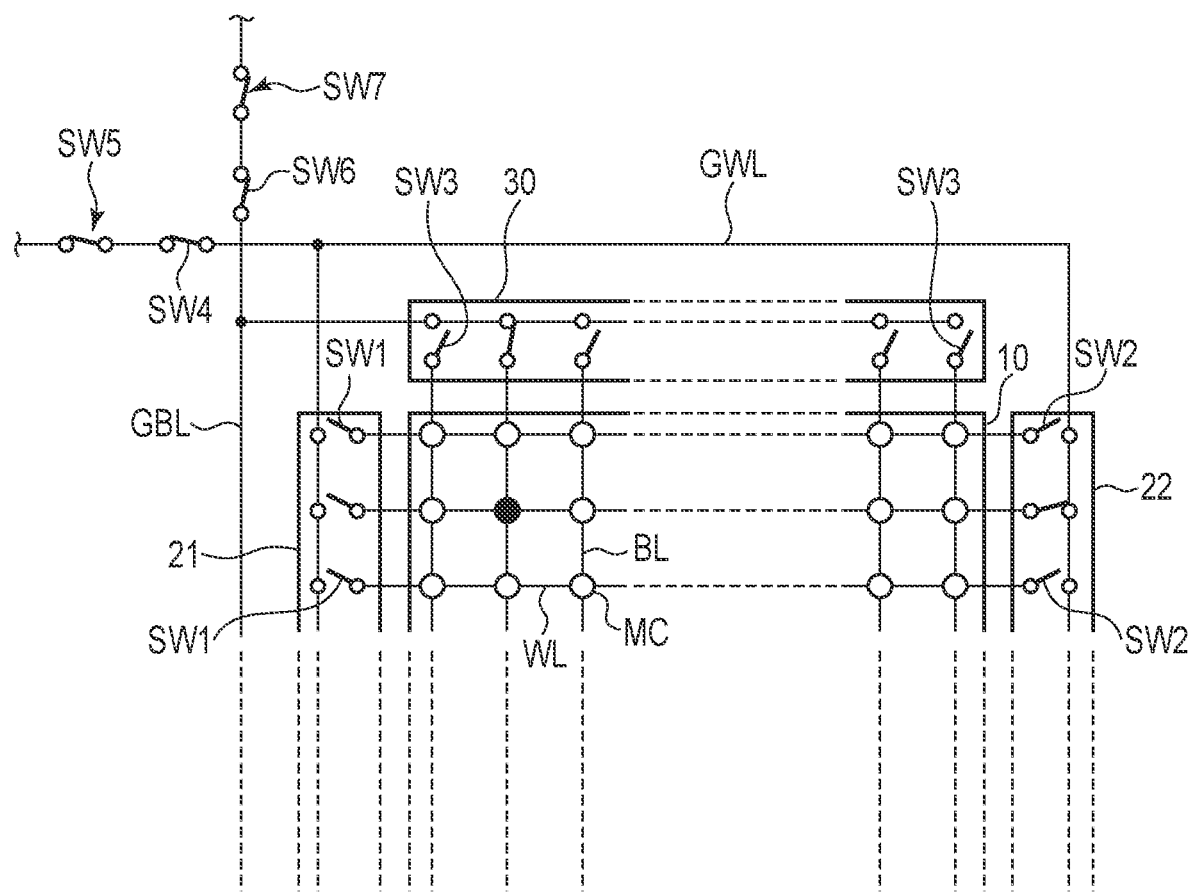
FIG. 6 is a view schematically showing the specific configuration of each of the memory cell array area, word-line selecting circuits, bit-line selecting circuit, and the like included in the memory device according to the embodiment.

FIG. 6 is a view schematically showing the specific configuration of each of the memory cell array area 10, word-line selecting circuit 21, word-line selecting circuit 22, bit-line selecting circuit 30, and the like.

As already described above, in the memory cell area 10, a plurality of memory cells MC are provided in a form of an array and, each of the memory cells MC is connected between a corresponding word line WL and corresponding bit line BL.

The word-line selecting circuit (first selecting circuit) 21 is interposed between one end of each of word lines (first wiring lines) WL and global word line (first common wiring line) GWL, and includes a plurality of switches (first switches) SW1 each of which is connected to one end of a corresponding word line WL.

The word-line selecting circuit (second selecting circuit) 22 is interposed between the other end of each of the word lines (first wiring lines) WL and global word line (first common wiring line) GWL, and includes a plurality of switches (second switches) SW2 each of which is connected to the other end of the corresponding word line WL.

The bit-line selecting circuit (third selecting circuit) 30 is interposed between one end of each of the bit lines (second wiring lines) BL and global bit line (second common wiring line) GBL, and includes a plurality of switches (third switches) SW3 each of which is connected to one end of a corresponding bit line BL.

To the global word line GWL, a switch SW5 is connected through a switch SW4. The switch SW4 is a switch configured to select the global, word line GWL, and switch SW5 is a switch configured to supply various voltages to the word lines WL. To the global bit line GBL, a switch SW7 is connected through a switch SW6. The switch SW6 is a switch configured to select the global bit line GBL, and switch SW7 is a switch configured to supply various voltages to the bit lines BL.

The switches SW1 to SW7 are constituted of, for example, transistors. It is possible to control the state (on-state/off-state) of each of the switches SW1 to SW7 by means of the control circuit 40 shown in FIG. 1.

Hereinafter, the fundamental operation to be carried out at the time of accessing (selecting) a desired memory cell MC will be described. It should be noted that in the following description, it is assumed that each of the switches SW4, SW5, SW6, and SW7 is set in advance to the on-state (conductive state).

When a desired memory cell MC is accessed (selected), a desired word line WL and desired bit line BL respectively connected to the desired memory cell MC are selected. That is, the state (on-state/off-state) of each of the switches SW1 and SW2 respectively connected to the desired word line WL is controlled by the control circuit 40, and state (on-state/off-state) of the switch SW3 connected to the desired bit line BL is controlled by the control circuit 40. Thereby, the path between the desired word line WL and global word line GWL is set to the electrically conductive state, and path between the desired bit line BL and global bit line GBL is set to the electrically conductive state.

In this embodiment, when the desired memory cell MC is accessed, the desired switch SW3 connected to the desired bit line BL is set to the on-state, and all the other switches SW3 not connected to the desired bit line BL are set to the off-state. On the other hand, during a first access period including a time point at which the selector 102 included in the desired memory cell MC makes a transition from the off-state to the on-state when the desired memory cell MC is accessed, one of the desired switch SW1 and desired switch SW2 respectively connected to the desired word line WL is set to the on-state and the other of the switches SW1 and SW2 is set to the off-state. All the other switches SW1 and switches SW2 not connected to the desired word line WL are set to the off-state.

By controlling the desired switch SW1 and desired switch SW2 in the manner described above, when the path between the desired word line WL and global word line GWL through the desired switch SW1 is defined as a first path, and the path between the desired word line WL and global word line GWL through the desired switch SW2 is defined as a second path, during the above-mentioned first access period, one of the first path and second path is set to the electrically conductive state and the other of the first path and second path is set to the electrically nonconductive state.

More generally speaking, when the path between the desired word line WL and global word line GWL through the word-line selecting circuit 21 is defined as the first path, and the path between the desired word line WL and global word line GWL through the word-line selecting circuit 22 is defined as the second path, during the first access period including the time point at which the selector 102 included in the desired memory cell MC makes a transition from the off-state to the on-state, one of the first path and second path is set to the electrically conductive state and the other of the first path and second path is set to the electrically nonconductive state.

Further, it is desirable that of the desired switch SW1 and desired switch SW2, the switch farther from the desired memory cell MC be set to the on-state, and switch closer to the desired memory cell MC be set to the off-state. More generally speaking, it is desirable that of the first path and second path, the path longer from the desired memory cell MC be set to the conductive state, and path shorter from the desired memory cell MC be set to the nonconductive state.

By carrying out the control described above, as will be described hereinafter, it becomes possible to suppress the peak current flowing through the memory cell MC when the memory cell MC is accessed.

Assuming that, when the desired memory cell MC is accessed, both the desired switch SW1 and desired switch SW2 are set to the on-state, the desired memory cell MC and global word line GWL are electrically connected to each other through both the desired switch SW1 and desired switch SW2. Accordingly, when the selector 102 included in the desired memory cell MC makes a transition from the off-state to the on-state, there is a possibility of a large peak current flowing from the global word line GWL to the desired memory cell MC through both the desired switch SW1 and desired switch SW2. In particular, there is a possibility of a very large peak current flowing through the memory cell MC due to the parasitic capacitance of the global word line GWL and current-voltage characteristics of the selector 102. That is, the global word line GWL has a large line width, and hence has large parasitic capacitance. Further, the selector 102 has the current-voltage characteristics as shown in FIG. 5. Due to these factors, when the selector 102 makes a transition from the off-state to the on-state, a very large peak current flows through the memory cell MC.

In this embodiment, one of the desired switch SW1 and desired switch SW2 is set to the on-state and the other is set to the off-state. Accordingly, when the selector 102 included in the desired memory cell MC makes a transition from the off-state to the on-state, it is possible to suppress the peak current flowing from the global word line GWL to the desired memory cell MC.

In particular, as will be described hereinafter, of the desired switch SW1 and desired switch SW2, the switch farther from the desired memory cell MC is set to the on-state and switch closer to the desired memory cell MC is set to the off-state, whereby it is possible to more effectively suppress the peak current flowing through the desired memory cell MC.

In general, the line width of the word line WL is smaller as compared with the line width of the global word line GWL, and hence the word line WL has larger parasitic resistance as compared with the global word line GWL. The longer the distance between the desired switch (desired switch SW1 or desired switch SW2) and desired memory cell MC, the larger the parasitic resistance of the word line WL becomes. The larger the parasitic resistance, the smaller the peak current flowing through the desired memory cell MC becomes. In this embodiment, of the desired switch SW1 and desired switch SW2, the switch farther from the desired memory cell MC is set to the on-state and switch closer to the desired memory cell MC is set to the off-state, whereby the path having the larger parasitic resistance is set to the conductive state and path having the smaller parasitic resistance is set to the nonconductive state. Accordingly, the current is supplied to the desired memory cell MC through only the path having the larger parasitic resistance, and hence it is possible to more effectively suppress the peak current flowing through the desired memory cell MC.

It should be noted that although the aforementioned switch control is applicable to both the read operation and write operation, by particularly applying the switch control to the read operation, it is possible to suppress read disturb attributable to the peak current flowing through the memory cell MC.

Further, although when the aforementioned switch control is carried out, there is a possibility of the operation speed of the read operation and write operation being lowered, by applying the aforementioned switch control to only the read operation, it is possible to avoid lowering of the operation speed at the time of the write operation, and suppress read disturb at the time of the read operation.

Next, a read operation and determining operation of read data in the memory device according to this embodiment will be described.

The read operation is carried out on the basis of the method described above by applying a predetermined voltage between the desired word line WL connected to the desired memory cell MC and desired bit line BL connected to the desired memory cell MC to thereby make a predetermined current flow through the desired memory cell MC. That is, during the above-mentioned first access period, a read voltage is applied between the desired word line WL and desired bit line BL, whereby the selector 102 included in the desired memory cell MC is set to the on-state, and resistive state (low-resistance state or high-resistance state) set to the magnetoresistance effect element 101 included in the desired memory cell MC is read through one of the first path (path through the desired switch SW1) and second path (path through the desired switch SW2).

The determining operation is carried out by the determination circuit 50 shown in FIG. 1. The determination circuit is a circuit configured to determine the determination object resistive state (low-resistance state or high-resistance state) set in advance to the magnetoresistance effect element 101 included in the desired memory cell MC. On the basis of the determination object resistive state, the binary data stored in the magnetoresistance effect element 101 is determined. More specifically, on the basis of the determination object voltage applied between the desired word line WL and desired bit line BL at the time when the selector 102 included in the desired memory cell MC makes a transition from the on-state to the off-state, the determination circuit 50 determines the determination object resistive state set in advance to the magnetoresistance effect element 101. Hereinafter, the determining operation to be carried out by the determination circuit 50 will specifically be described.

Figure 7:
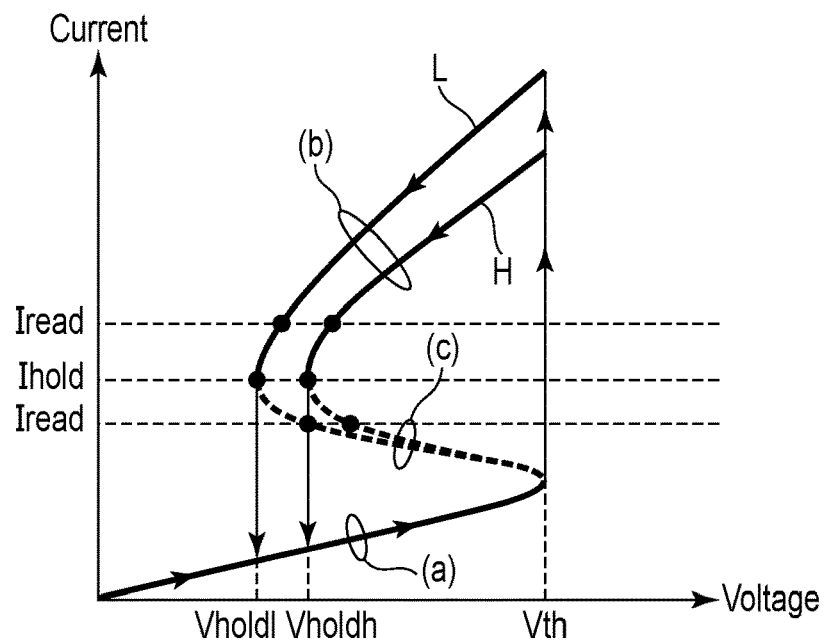
FIG. 7 is a view schematically showing the current-voltage characteristics of the memory cell included in the memory device according to the embodiment at the time of read.

FIG. 7 is a view schematically showing the current-voltage characteristics of the selected memory cell (desired memory cell MC) at the time of read of the memory cell MC. In FIG. 7, the axis of abscissas indicates the voltage (voltage applied between the selected word line WL and selected bit line BL) between both ends of the selected memory cell MC, and axis of ordinate indicates the current flowing through the selected memory cell MC. The characteristics (L) are the characteristics at the time when the magnetoresistance effect element 101 is set to the low-resistance state, and characteristics (H) are the characteristics at the time when the magnetoresistance effect element 101 is set to the high-resistance state. It should be notified that in each of the cases of the characteristics (L) and characteristics (H), the part (c) of the characteristics indicated by a broken line is a virtual characteristics part not actually appearing.

In the memory cell MC including the magnetoresistance effect element 101, in general, the off resistance (resistance of the selector 102 in the off-state) of the selector 102 is sufficiently greater than the resistance (resistance in the low-resistance state, resistance in the high-resistance state) of the magnetoresistance effect element 101. Accordingly, the current-voltage characteristics (corresponding to the characteristics part (a)) of the memory cell before the selector 102 makes a transition from the off-state to the on-state are substantially identical in both the case where the magnetoresistance effect element 101 is set to the low-resistance state and case where the magnetoresistance effect element 101 is set to the high-resistance state. That is, the voltage (threshold voltage Vth) applied between both the ends of the memory cell MC when the selector 102 makes a transition from the off-state to the on-state is substantially identical in both the case where the magnetoresistance effect element 101 is set to the low-resistance state and case where the magnetoresistance effect element 101 is set to the high-resistance state.

On the other hand, after the selector 102 makes a transition from the off-state to the on-state, a difference in the current-voltage characteristics of the memory cell MC is caused between the case where the magnetoresistance effect element 101 is in the low-resistance state and case where the magnetoresistance effect element 101 is in the high-resistance state. Accordingly, when a read current Iread is supplied to the memory cell MC, a voltage difference is caused in the voltage between both the ends of the memory cell MC between the case where the magnetoresistance effect element 101 is in the low-resistance state and case where the magnetoresistance effect element 101 is in the high-resistance state. It is possible to determine the resistive state (low-resistance state, high-resistance state) of the magnetoresistance effect element 101 on the basis of the above voltage difference.

Although when the read current Iread is greater than the hold current Ihold, no big problem is caused, when the read current Iread is less than the hold current Ihold, there is a possibility of a big problem being caused. Accordingly, it is important to resolve such a problem.

It should be noted that the hold current Ihold implies a current which flows through the memory cell MC when the selector 102 makes a transition from the on-state to the off-state. Further, the voltage applied to the memory cell MC when the selector 102 makes a transition from the on-state to the off-state is defined as the hold voltage Vhold. That is, a voltage corresponding to the hold current Ihold is defined as the hold voltage Vhold. Further, the hold voltage of the case where the magnetoresistance effect element 101 is in the low-resistance state is defined as the hold voltage Vholdl, and hold voltage of the case where the magnetoresistance effect element 101 is in the high-resistance state is defined as the hold voltage Vholdh.

In the case where the read current Iread is less than the hold current Ihold, when the selector 102 makes a transition from the on-state to the off-state, the current-voltage characteristics of the memory cell. MC shifts from the characteristics (b) not to the characteristics (c) but to the characteristics (a). The memory cell MC continues to be supplied with the read current Iread, and hence there is a possibility of a phenomenon in which the voltage of the memory cell MC increases to the threshold voltage Vth according to the characteristics (a) and thereafter shifts to the hold voltage Vhold again occurring. As a result, the threshold voltage Vth and hold voltage Vhold are alternately and repetitively applied to the memory cell MC, and there is a possibility of a phenomenon in which the applied voltage of the memory cell MC oscillates occurring. When such a phenomenon occurs, it becomes impossible to carry out a stable read operation.

Thus, in this embodiment, the determination object resistive state (low-resistance state or high-resistance state) set in advance to the magnetoresistance effect element 101 is determined in the following manner.

Figure 8:
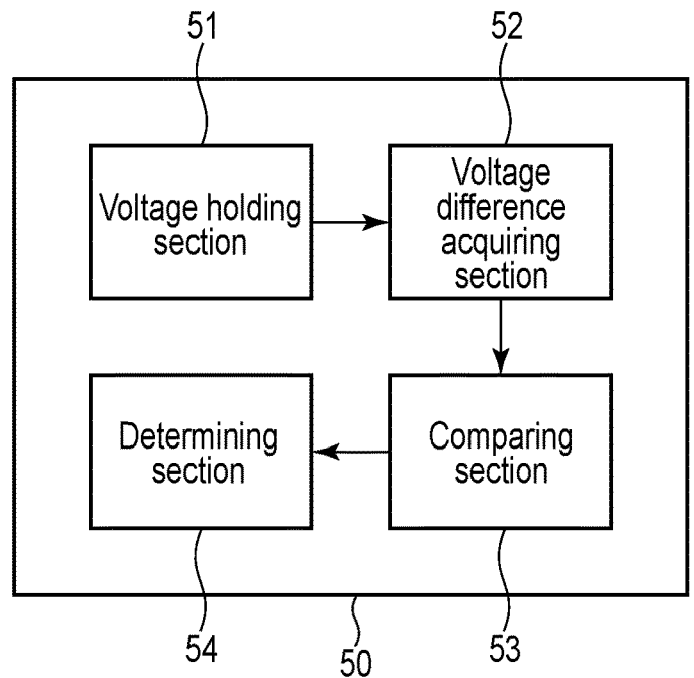
FIG. 8 is a block diagram showing the functional configuration of a determination circuit included in the memory device according to the embodiment.

FIG. 8 is a block diagram showing the functional configuration of the determination circuit 50 in which the determining operation is carried out. Each of FIGS. 9A to 9K is a view showing a voltage-acquiring operation necessary for the determining operation.

In the voltage-acquiring operations shown in FIGS. 9A to 9K, broadly classified first read operations (operations shown in FIGS. 9A to 9E) and second read operations (operations shown in FIGS. 9G to 9K) to be carried out after the first read operations are included.

When the access period for carrying out the read operations with respect to the desired memory cell MC is started, all the switches SW4, SW5, SW6, and SW7 are set to the on-state (conductive state). Further, in order to select the desired bit line BL connected to the desired memory cell MC, the desired switch SW3 connected to the desired bit line BL is set to the on-state (conductive state). Further, in order to select the desired word line WL connected to the desired memory cell MC, one of the desired switch SW1 and desired switch SW2 is set to the on-state. The other of the desired switch SW1 and desired switch SW2 is set to the off-state.

Hereinafter, for simplification of the description, it is assumed that the desired switch SW1 is set to the off-state and desired switch SW2 is set to the on-state. That is, it is assumed that the distance between the desired switch SW1 and desired memory cell MC is shorter than the distance between the desired switch SW2 and desired memory cell MC. In the example shown in FIG. 6, the case where the second memory cell MC (memory cell MC indicated by a black circle) from the left of the memory array area 10 and second from the top thereof is selected as the desired memory cell MC is shown.

Hereinafter, assuming that the states of the aforementioned switches SW1 to SW7 are the initial switch states, operations to be carried out after the access period is started will be described with reference to FIGS. 9A to 9K. It should be noted that for simplification of the description, in FIGS. 9A to 9K, only the desired memory cell MC, desired word line WL connected to the desired memory cell MC, and desired bit line BL connected to the desired memory cell MC are shown. Accordingly, in the following descriptions, the memory cell MC implies the desired memory cell MC, word line WL implies the desired word line WL, and bit line BL implies the desired bit line BL.

Figure 9A:
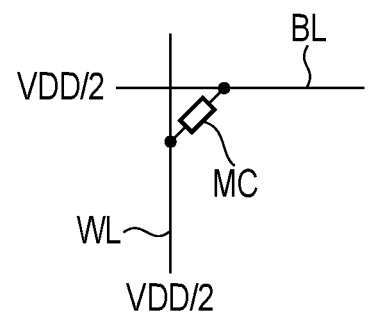
FIG. 9K is a view showing a voltage-acquiring operation necessary for a determining operation in the memory device according to the embodiment.

First, as shown in FIG. 9A, the same voltage (VDD/2) is applied to the word line WL and bit line BL. The voltage VDD is a voltage slightly higher than the aforementioned threshold voltage Vth (see FIG. 7). More specifically, the voltage (VDD/2) is applied to the desired word line WL through the switch SW5, switch SW4, global word line GWL, and desired switch SW2, and voltage (VDD/2) is applied to the desired bit line BL through the switch SW7, switch SW6, global bit line GBL, and desired switch SW3. Accordingly, the voltage applied to the desired memory cell MC is zero.

Figure 9B:
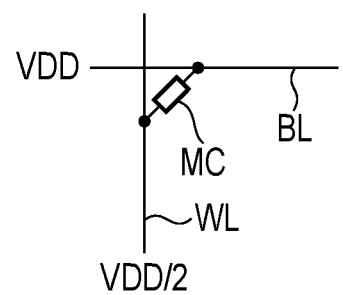

Next, as show in FIG. 9B, the voltage VDD is applied to the bit line BL. Further, to the word line WL, the voltage (VDD/2) identical to the applied voltage of FIG. 9A is applied.

Figure 9C:
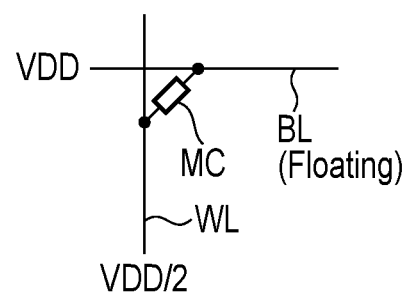

Next, as shown in FIG. 9C, the bit line BL is set to the floating state. More specifically, by setting the switch SW7 to the off-state, the bit line BL is set to the floating state. The bit line BL is in the floating state, and hence the voltage of the bit line BL is maintained at VDD. Further, the applied voltage of the word line WL is maintained at (VDD/2).

Figure 9D:
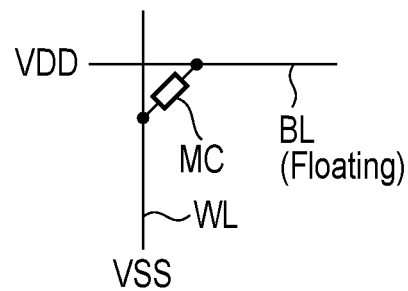

Next, as shown in FIG. 9D, in the state where the bit line BL is maintained in the floating state, a voltage VSS (for example, ground voltage) is applied to the word line WL. Thereby, between the word line WL and bit line BL, a voltage (VDD−VSS) higher than the threshold voltage Vth is applied. As a result, the voltage (VDD−VSS) higher than the threshold voltage Vth is applied to also the memory cell MC, and the selector 102 in the memory cell MC makes a transition from the off-state to the on-state. Thereby, a current flows between the word line WL and bit line BL through the memory cell MC. As already described previously, of the switch SW1 and switch SW2 each connected to the word line WL, although the switch SW2 is set to the on-state, switch SW1 is set to the off-state. Accordingly, as already described, it is possible to suppress the peak current occurring when the selector 102 makes a transition from the off-state to the on-state.

As described above, the selector 102 makes a transition from the off-state to the on-state, whereby a current flows between the word line WL and bit line BL through the memory cell MC. At this time, the bit line BL is maintained in the floating state, and hence the potential of the bit line BL automatically and gradually decreases.

Figure 9E:
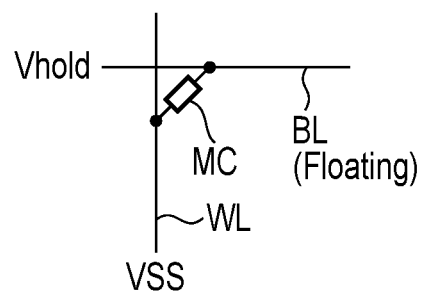

As a result, the potential of the bit line BL reaches the hold voltage Vhold (Vholdl or Vholdh shown in FIG. 7) as shown in FIG. 9E. That is, the voltage between the word line WL and bit line BL becomes the hold voltage Vhold, and the voltage between the both ends of the memory cell MC becomes the hold voltage Vhold. As already described previously, when the voltage between the both ends of the memory cell MC becomes the hold voltage Vhold, the selector 102 makes a transition from the on-state to the off-state. Accordingly, the current stops flowing through the memory cell MC, and the voltage between the both ends of the memory cell MC is maintained at the hold voltage Vhold. That is, the potential of the bit line BL is maintained at the hold voltage Vhold. When the determination object resistive state set to the magnetoresistance effect element 101 in the memory cell MC is the low-resistance state, the hold voltage is Vholdl (see FIG. 7) and, when the determination object resistive state set to the magnetoresistance effect element 101 in the memory cell MC is the high-resistance state, the hold voltage is Vholdh (see FIG. 7). The determination circuit 50 detects the hold voltage (Vholdl or Vholdh) at this time as a determination object voltage, and holds the detected voltage in a voltage holding section 51 (see FIG. 8).

Figure 9F:
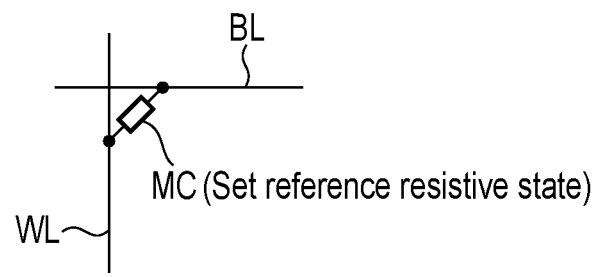

After acquiring the determination object voltage by the first read operations in the manner described above, one of the low-resistance state and high-resistance state is set to the magnetoresistance effect element 101 in the memory cell MC as the reference resistive state as shown in FIG. 9F. That is, one of the low-resistance state and high-resistance state is written to the magnetoresistance effect element 101 as the reference resistive state. More specifically, by applying a predetermined write voltage between the word line WL and bit line BL to thereby cause the selector 102 to make a transition from the off-state to the on-state, and cause a predetermined write current to flow through the magnetoresistance effect element 101, the reference resistive state is set to the magnetoresistance effect element 101.

After setting the reference resistive state to the magnetoresistance effect element 101 in this manner, the second read operations shown in FIGS. 9G to 9K are carried out.

The fundamental sequence of the second read operations is identical to the sequence of the above-mentioned first read operations and, in the manner identical to the sequence of FIGS. 9A to 9E, the sequence of FIGS. 9G to 9K is carried out. The fundamental operation of each of the word-line selecting circuits 21 and 22 in the second read operations is identical to the operation of each of the word-line selecting circuits 21 and 22 in the aforementioned first read operations.

Figure 9G:
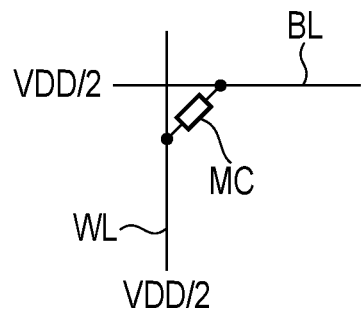
Figure 9H:
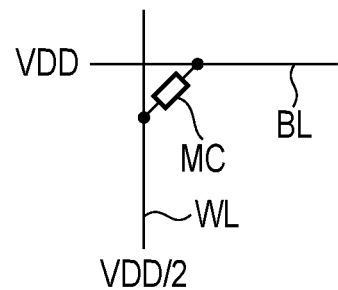
Figure 9I:
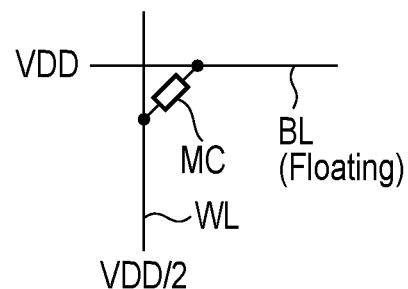
Figure 9J:
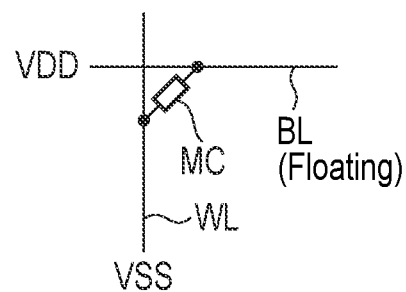

In the step of FIG. 9G, as in the case of the step of FIG. 9A, the same voltage VDD/2 is applied to both the word line W. and bit line BL. In the step of FIG. 9H, as in the case of the step of FIG. 9B, the voltage VDD is applied to the bit line BL. In the step of FIG. 9I, as in the case of the step of FIG. 9C, the bit line BL is set to the floating state. In the step of FIG. 9J, as in the case of the step of FIG. 9D, in the state where the bit line BL is maintained in the floating state, the voltage VSS is applied to the word line WL. Thereby, the voltage (VDD−VSS) is applied to the memory cell. MC, and the selector 102 in the memory cell MC makes a transition from the off-state to the on-state.

Figure 9K:
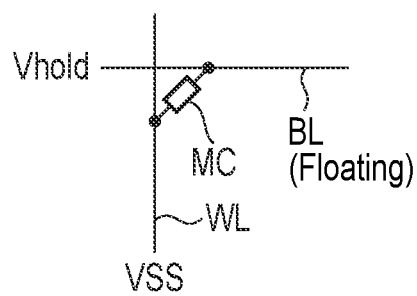

As a result, the potential of the bit line BL automatically and gradually decreases and, in the step of FIG. 9K, as in the case of the step of FIG. 9E, the potential of the bit line BL reaches the hold voltage Vhold (Vholdl or Vholdh). That is, the voltage between the word line WL and bit line BL becomes the hold voltage Vhold, and the voltage between the both ends of the memory cell MC becomes the hold voltage Vhold. Thereby, the selector 102 makes a transition from the on-state to the off-state, and the voltage between the both ends of the memory cell MC is maintained at the hold voltage Vhold. At this time, when the reference resistive state set to the magnetoresistance effect element 101 in the step of FIG. 9F is the low-resistance state, the hold voltage becomes Vholdl and, when the reference resistive state set to the magnetoresistance effect element 101 in the step of FIG. 9F is the high-resistance state, the hold voltage becomes Vholdh. The determination circuit 50 detects the hold voltage (Vholdl or Vholdh) at this time as a reference voltage, and holds the detected voltage in the voltage holding section 51.

In the manner described above, the reference voltage is acquired by the second read operations.

In the determination circuit 50, the determination object resistive state set in advance to the magnetoresistance effect element 101 is determined on the basis of the determination object voltage acquired by the first read operations and reference voltage acquired by the second read operations. That is, the binary data stored in the magnetoresistance effect element 101 is determined. More specifically, the determination is carried out in the following manner.

First, a voltage difference between the determination object voltage and reference voltage is acquired by a voltage difference acquiring section 52 (see FIG. 8) in the determination circuit 50. The voltage difference is compared with a criterion voltage difference by a comparing section 53 in the determination circuit 50. A determining section 54 in the determination circuit 50 determines the determination object resistive state of the magnetoresistance effect element 101 on the basis of a comparison result obtained by the comparing section 53. More specifically, when the voltage difference between the determination object voltage and reference voltage is less than the criterion voltage difference, it is determined that the determination object resistive state of the magnetoresistance effect element 101 is a resistive state identical to the reference resistive state and, when the voltage difference between the determination object voltage and reference voltage is greater than the criterion voltage difference, it is determined that the determination object resistive state of the magnetoresistance effect element 101 is a resistive state different from the reference resistive state. Hereinafter, descriptions will be given more specifically.

The first read operations and second read operations are carried out with respect to the same memory cell (desired memory cell) MC, and determination object voltage and reference voltage are acquired with respect to the same memory cell (desired memory cell) MC. Accordingly, when the determination object resistive state is the resistive state identical to the reference resistive state, it is conceivable that the determination object voltage becomes a voltage identical to the reference voltage. Thus, when the voltage difference between the determination object voltage and reference voltage is less than the criterion voltage difference, it is determined that the determination object resistive state of the magnetoresistance effect element 101 is the resistive state identical to the reference resistive state and, when the voltage difference between the determination object voltage and reference voltage is greater than the criterion voltage difference, it is determined that the determination object resistive state of the magnetoresistance effect element 101 is the resistive state different from the reference resistive state. For example, in the case where the reference resistive state is the low-resistance state, when the voltage difference is less than the criterion voltage difference, it is determined that the determination object resistive state is the low-resistance state and, when the voltage difference is greater than the criterion voltage difference, it is determined that the determination object resistive state is the high-resistance state. Further, in the case where the reference resistive state is the high-resistance state, when the voltage difference is less than the criterion voltage difference, it is determined that the determination object resistive state is the high-resistance state and, when the voltage difference is greater than the criterion voltage difference, it is determined that the determination object resistive state is the low-resistance state. It should be noted that as the criterion voltage difference, for example, (Vholdh−Vholdl)/2 is set.

As described above, in the operations shown in FIGS. 9A to 9K, in the first and second read operations, of the switches SW1 and SW2 connected to the desired word line WL, the switch SW1 is set to the off-state, and only switch SW2 is set to the on-state. Accordingly, it is possible to suppress the peak current occurring when the selector 102 makes a transition from the off-state to the on-state, and prevent read disturb from occurring.

Further, in the operations shown in FIGS. 9A to 9K, the determination object resistive state of the magnetoresistance effect element 101 is determined on the basis of the determination object voltage applied between the word line WL and bit line BL when the selector 102 makes a transition from the on-state to the off-state. At the time point at which the selector 102 makes a transition from the on-state to the off-state, the hold current Ihold of FIG. 7 flows through the memory cell MC. Accordingly, it is possible to prevent the problem (problem that the applied voltage of the memory cell MC oscillates, and the like) caused by using a read current Iread less than the old current Ihold from occurring, and carry out a stable read operation.

Further, in the operations shown in FIGS. 9A to 9K, by acquiring the determination object voltage in the state where the bit line BL is maintained in the floating state, it is possible to automatically acquire the hold voltage Vhold as the determination object voltage. Accordingly, it is possible to easily and securely acquire the determination object voltage.

Further, in the operations shown in FIGS. 9A to 9K, the first read operations and second read operations are carried out with respect to the same memory cell MC, and determination object voltage and reference voltage are acquired for the same memory cell MC. That is, in the operations shown in FIGS. 9A to 9K, the read operations are carried out by self-reference read. Accordingly, even when the characteristics of the resistance change memory elements vary in the chip, it is possible to securely carry out read.

It should be noted that in the above-described embodiment, when the direction of the write current in the write operation of FIG. 9F and direction of the read current in the second read operations of FIGS. 9G to 9K are identical to each other, and write voltage Vwrite is greater than the voltage VDD, it is possible to simplify the second read operations. More specifically, as will be described hereinafter, the steps of FIGS. 9G to 9J can be omitted.

In the write operation of FIG. 9F, the write voltage Vwrite is applied between the word line WL and bit line BL, and selector 102 is in the on-state. In the state where the write voltage Vwrite is applied between the word line WL and bit line BL, when the bit line BL is shifted to the floating state, as in the case of the operation already described previously, the potential of the bit line BL automatically decreases. As a result, as in the case of the step of FIG. 9K, the voltage between the word line WL and bit line BL becomes the hold voltage Vhold. By using the hold voltage at this time as the reference voltage, it is possible to execute the operations identical to the above-described embodiment, and simplify the second read operations.

Figure 10:
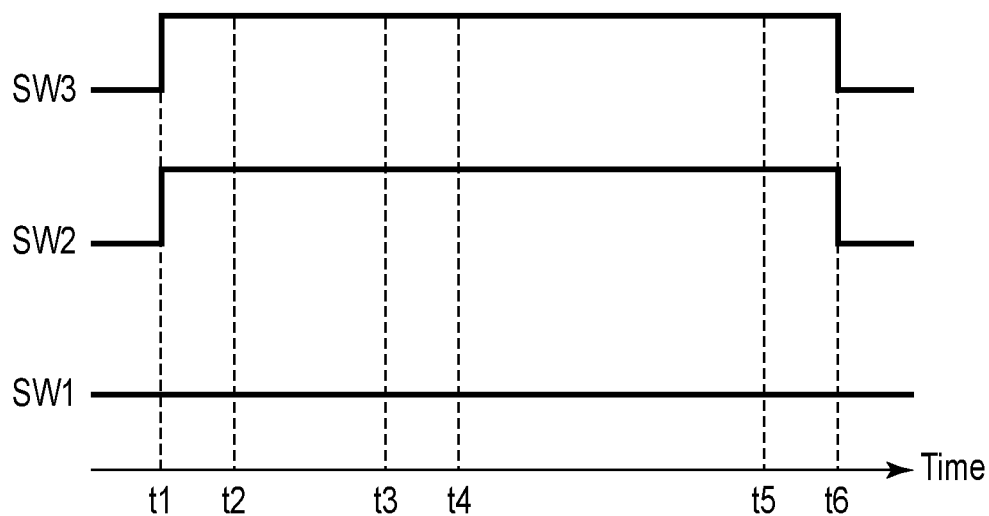
FIG. 10 is a timing chart showing a read operation in the memory device according to the embodiment.

FIG. 10 is a timing chart showing the states of the switches SW1, SW2, and SW3 (desired switches SW1, SW2, and SW3 connected to the desired memory cell MC) in the above-described first read operation period (operation period shown in FIGS. 9A to 9E) and second read operation period (operation period shown in FIGS. 9G to 9K).

As shown in FIG. 10, during the period from t1 to t6, the switch SW1 is maintained in the off-state, and switch SW2 and switch SW3 are maintained in the on-state.

The period from t1 to t2 corresponds mainly to the operation periods of FIG. 9A and FIG. 9G. That is, at the point t1, the switches SW2 and SW3 enter the on-states, and voltage (VDD/2) is applied to the word line WL and bit line BL.

The period from t2 to t3 corresponds mainly to the operation periods of FIG. 9B and FIG. 9H. That is, at the point t2, the voltage VDD is applied to the bit line BL, and voltage of the word line WL is maintained at (VDD/2). The period from t2 to t3 corresponds to the pre-charge period, and the large parasitic capacitance of the global word line GWL is pre-charged with electric charge.

The period from t3 to t4 corresponds mainly to the operation periods of FIG. 9C and FIG. 9I. That is, at the point t3, the bit line BL is shifted to the floating state.

The period from t4 to t5 corresponds mainly to the operation periods of FIG. 9D and FIG. 9E, and mainly to the operation periods of FIG. 9J and FIG. 9K. That is, at the point t4, the voltage VSS is applied to the word line WL and, from the point t4 to the point t5, a current flows between the word line WL and bit line BL through the memory cell MC. The period from t4 to t5 corresponds to the discharge period, and the electric charge held in the large parasitic capacitance of the global word line GWL is discharged.

The period from t5 to t6 is the period from the time when the discharge period ends to the time when the switch SW2 and switch SW3 are shifted to the off-state. It should be noted that the switch SW2 and switch SW3 may also be set to the off-state immediately at the point (point t5) when the discharge period ends (in this case, t5=t6).

FIG. 11, FIG. 12, FIG. 13, and FIG. 14 are timing charts respectively showing a first, second, third, and fourth modified examples of the read operation. That is, FIG. 11, FIG. 12, FIG. 13, and FIG. 14 are timing charts respectively showing the first, second, third, and fourth modified examples of the states of the switches SW1, SW2, and SW3 (desired switches SW1, SW2, and SW3 each connected to the desired memory cell MC) in the above-described first read operation period (operation period shown in FIGS. 9A to 9E) and second read operation period (operation period shown in FIGS. 9G to 9K).

First, the first modified example shown in FIG. 11 will be described below.

Although in the example (example of FIG. 10) of the above-described embodiment, during the period from t1 to t6, the switch SW1 is set to the off-state and switch SW2 and switch SW3 are set to the on-state, in this modified example, the switch SW1 is set to the on-state from the point t1 to the point t7. As described above, the switch SW1 may be set to the on-state until the point t4 when the discharge is started.

That is, the switch SW1 may be set to the on-state until the point t4 when the selector makes a transition from the off-state to the on-state. If the switch SW1 is already set to the off-state at the point (point when the discharge is started) when the selector 102 makes a transition from the off-state to the on-state, it is possible to suppress the peak current flowing through the memory cell MC.

Next, the second modified example shown in FIG. 12 will be described below.

In this modified example, the switch SW1 is set to the on-state from the point t8 to the point t6. As described above, the switch SW1 may be set to the on-state after an elapse of a predetermined time from the point t4 when the discharge is started. That is, after an elapse of a predetermined time from the point t4 when the selector 102 makes a transition from the off-state to the on-state, the switch SW1 may be set to the on-state. If the switch SW1 is already set to the off-state at the point when the selector 102 makes a transition from the off-state to the on-state, it is possible to suppress the peak current flowing through the memory cell MC.

More generally speaking the operation of this modified example, when the path between the desired word line WL and global word line GWL through the word-line selecting circuit 21 is defined as the first path, and path between the desired word line WL and global word line GWL through the word-line selecting circuit 22 is defined as the second path, during the second access period after the first access period including the time point at which the selector 102 included in the desired memory cell MC makes a transition from the off-state to the on-state, both the first path and second path may be set to the electrically conductive state.

In this modified example, by setting the switch SW1 to the on-state within the discharge period, it is possible to carry out discharge through both the switch SW1 and switch SW2, and hence it is possible to shorten the discharge period.

Figure 13:
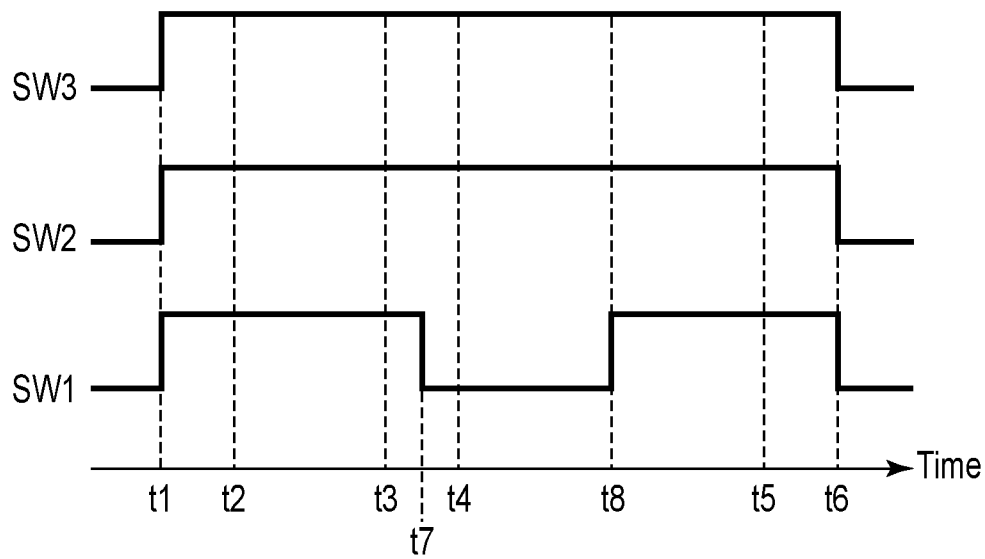
FIG. 13 is a timing chart showing a third modified example of the read operation in the memory device according to the embodiment.

Next, the third modified example shown in FIG. 13 will be described below.

Figure 11:
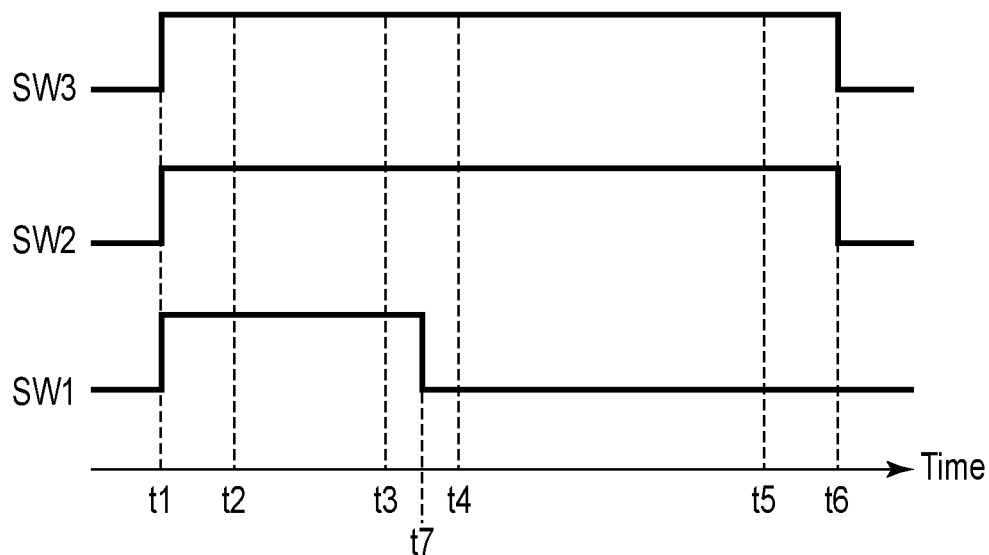
FIG. 11 is a timing chart, showing a first modified example of the read operation in the memory device according to the embodiment.
Figure 12:
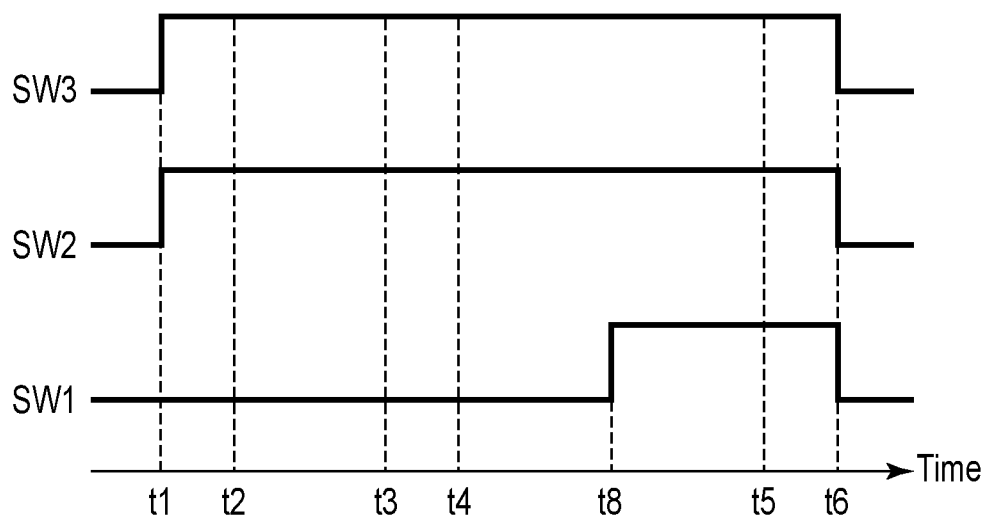
FIG. 12 is a timing chart showing a second modified example of the read operation in the memory device according to the embodiment.

This modified example is an example obtained by combining the first modified example shown in FIG. 11 and second modified example shown in FIG. 12 with each other. In this modified example too, it is possible to suppress the peak current flowing through the memory cell MC.

Figure 14:
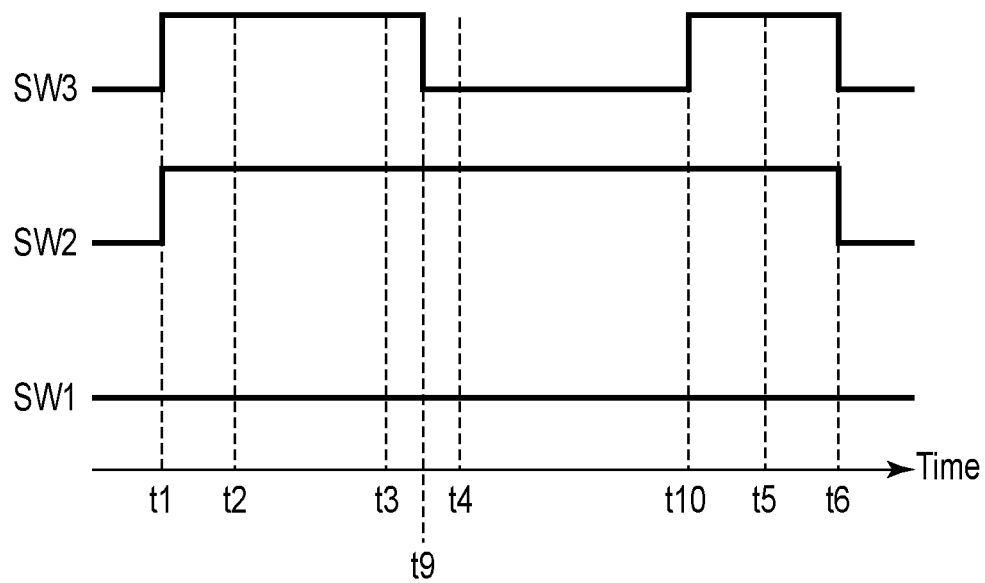
FIG. 14 is a timing chart showing a fourth modified example of the read operation in the memory device according to the embodiment.

Next, the fourth modified example shown in FIG. 14 will be described below.

Although in the example (example of FIG. 10) of the above-described embodiment, the switch SW3 connected to the bit line BL is set to the on-state during the period from t1 to t6, in this modified example, the switch SW3 is set to the off-state from the point t9 to the point t10. As described above, the switch SW3 may be shifted from the on-state to the off-state within the period from the point t3 when the pre-charge is completed to the point t4 when the discharge is started. It should be noted that finally the voltage signal of the bit line BL must be transmitted to the global bit line GBL, and hence it is necessary to restore the switch SW3 to the on-state before the point t6 (in the example shown in FIG. 14, the switch SW3 is restored to the on-state at the point t10).

In this modified example, at the point t4 when the selector makes a transition from the off-state to the on-state and discharge is started, the switch SW3 is already set to the off-state, and hence it is possible to suppress the peak current attributable to discharging of the electric charge pre-charged in the large parasitic capacitance of the global bit line GBL.

It should be noted that, more generally speaking the operation of this modified example, during the third access period including the time point at which the selector 102 included in the desired memory cell MC makes a transition from the off-state to the on-state, the third path between the desired bit line BL and global bit line GBL through the bit-line selecting circuit 30 may also be set to the electrically nonconductive state.

Next, the write operation in the memory device according to this embodiment will be described below.

Although in the write operation, when the desired memory cell MC is accessed, both the desired switch SW1 and desired switch SW2 each connected to the desired word line WL may be set to the on-state, and write to the desired memory cell may be carried out, switch control identical to the above-described read operations (first read operations, second read operations) may also be carried out.

That is, in the case of carrying out the write operation too, when the desired memory cell MC is accessed, during the first access period including the time point at which the selector 102 included in the desired memory cell MC makes a transition from the off-state to the on-state, one of the desired switch SW1 and desired switch SW2 each connected to the desired word line WL may be set to the on-state and the other of the switches SW1 and SW2 may be set to the off-state. In this case, it is desirable that, of the desired switches SW1 and SW2, the switch farther from the desired memory cell MC be set to the on-state and switch closer to the desired memory cell MC be set to the off-state.

In the above-described write operation, during the first access period, the write voltage is applied between the desired word line WL and desired bit line BL, whereby the selector 102 included in the desired memory cell MC is set to the on-state, and desired resistive state (low-resistance state or high-resistance state) is written to the magnetoresistance effect element 101 included in the desired memory cell MC through one of the first path (path between the desired word line WL and global word line GWL through the word-line selecting circuit 21) and second path (path between the desired word line WL and global word line GWL through the word-line selecting circuit 22).

By carrying out control as described above, it is possible, even during the write period, to suppress the peak current flowing through the memory cell MC when the memory cell MC is accessed.

Figure 15:
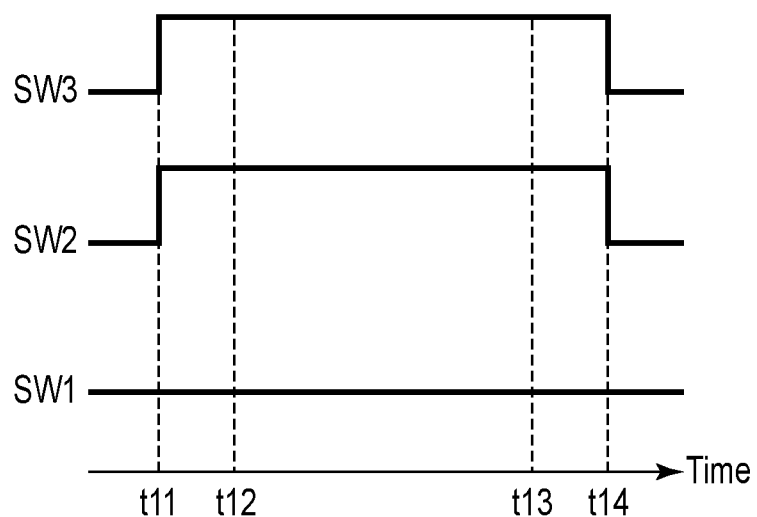
FIG. 15 is a timing chart showing a fundamental operation example of the write operation in the memory device according to the embodiment.

FIG. 15 is a timing chart, showing a fundamental operation example of the aforementioned write operation.

Figure 16:
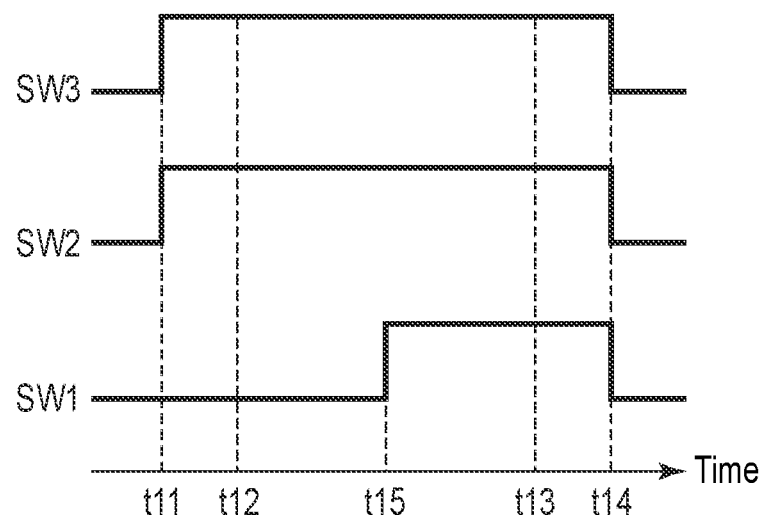
FIG. 16 is a timing chart showing a modified example of the write operation in the memory device according to the embodiment.

FIG. 16 is a timing chart, showing a modified example of the aforementioned write operation. That is, FIG. 15 and FIG. 16 are timing charts showing the states of the switches SW1, SW2, and SW3 (desired switches SW1, SW2, and SW3 each connected to the desired memory cell MC) during the above-mentioned write operation period.

In the fundamental operation example of FIG. 15, during the period from t11 to t14, the switch SW1 is maintained in the off-state, and switches SW2 and SW3 are maintained in the on-state. At the point t11, the switches SW2 and SW3 enter the on-state, and during the period from t12 to t13, a predetermined write voltage is applied between the word line WL and bit line BL. At the point t14, the switches SW2 and SW3 are set to the off-state. It should be rioted that during the whole period from t11 to t14, the predetermined write voltage may also be applied between the word line WL and bit line BL.

In the modified example of FIG. 16, the switch SW1 is set to the on-state from the point t15 to the point t14. As described above, after a predetermined time elapses from the point t12 when the selector makes a transition from the off-state to the on-state and write is started, the switch SW1 may be set to the on-state.

In each of the operation examples of FIG. 15 and FIG. 16, at the point when the selector makes a transition from the off-state to the on-state, the switch SW1 is set to the off-state. Accordingly, it is possible to suppress the peak current flowing through the memory cell MC even in the write operation.

Figure 17:
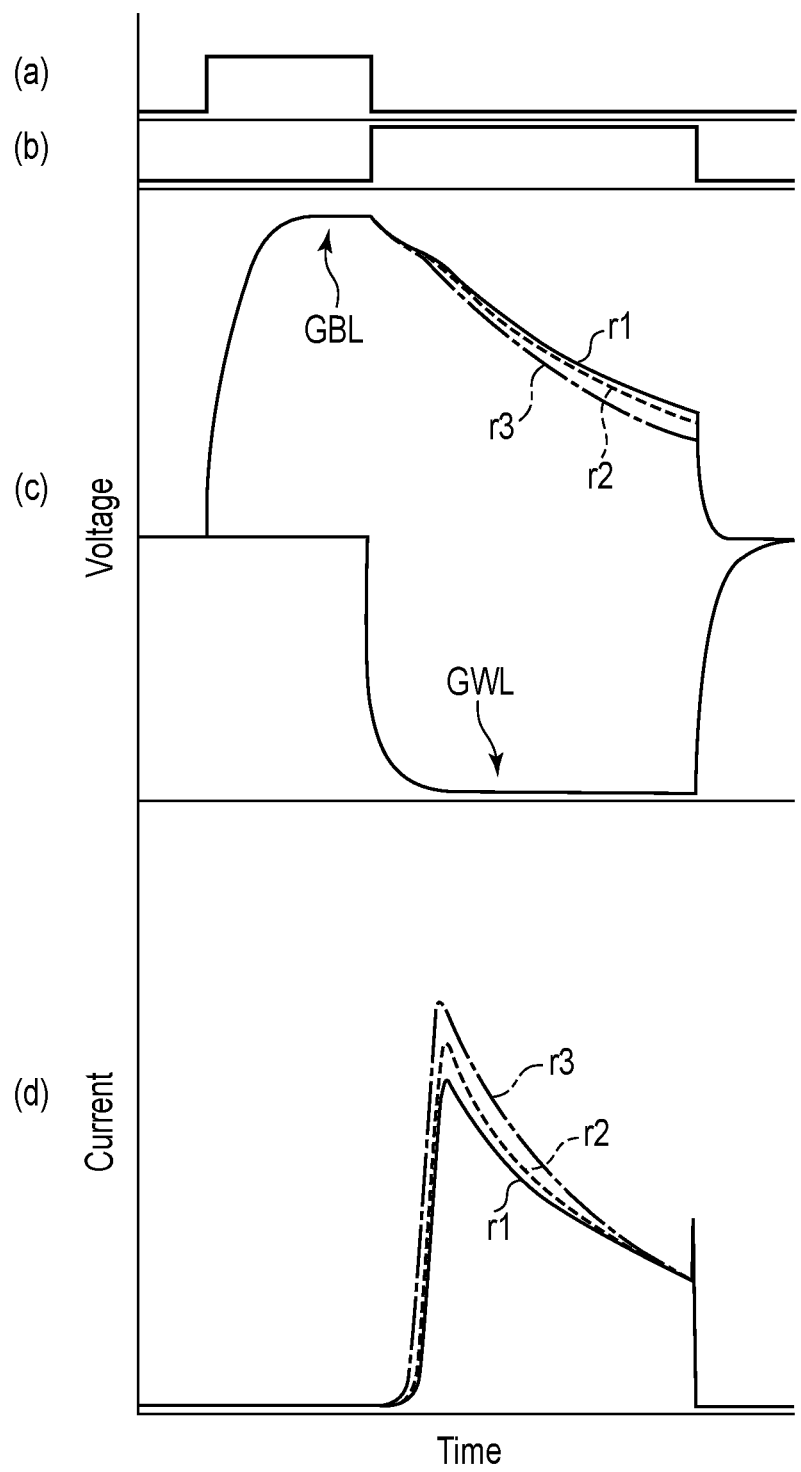
FIG. 17 is a view showing a simulation result of a peak current in the memory device according to the embodiment.
Figure 18:
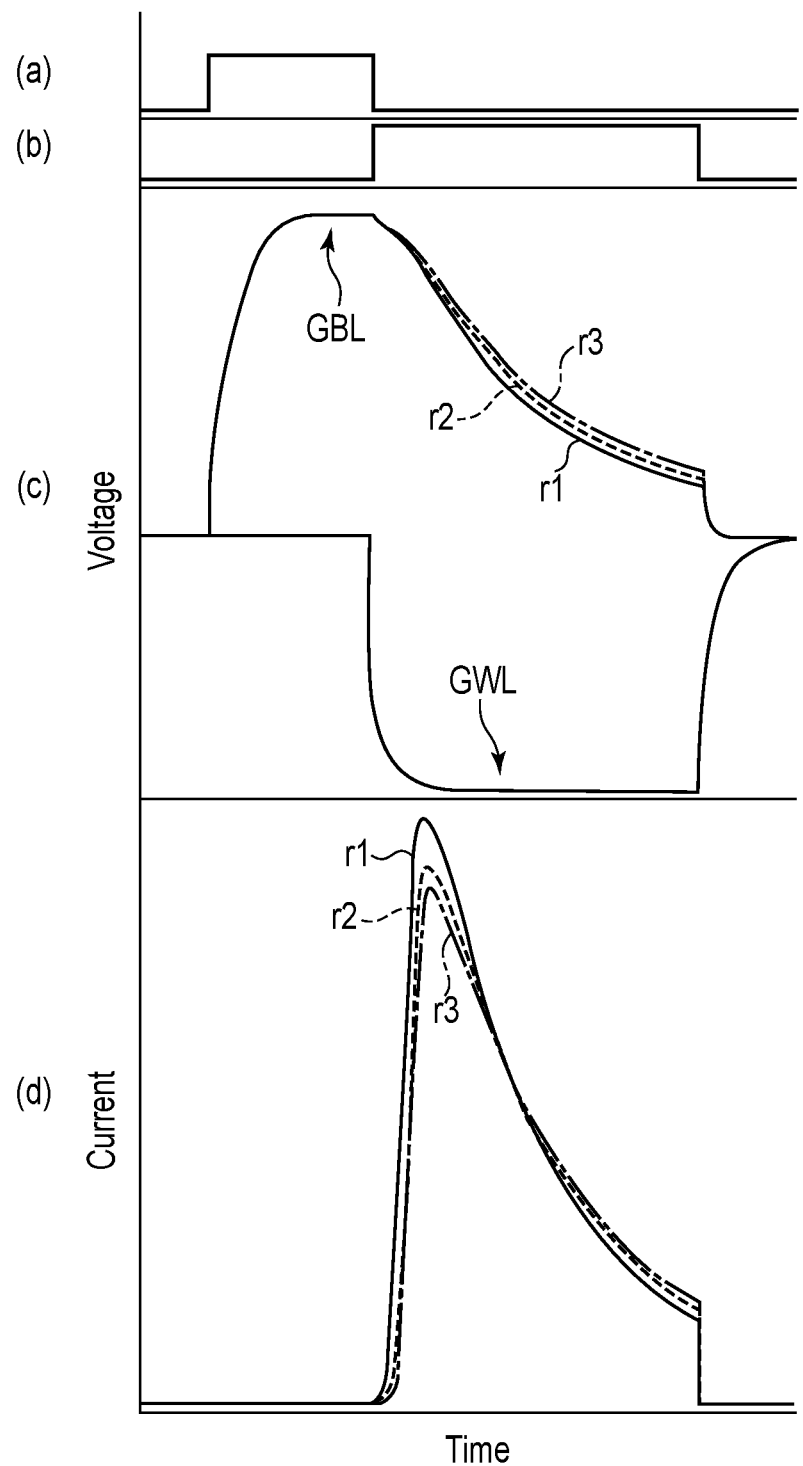
FIG. 18 is a view showing a simulation result of a peak current in a comparative example of the memory device according to the embodiment.

Each of FIG. 17 and FIG. 18 is a view showing a simulation result of a peak current suppressing effect in this embodiment.

FIG. 17 is a view showing a simulation result at the time of the read operation of this embodiment. That is, FIG. 17 is a view showing a simulation result at the time when the switch SW1 is set to the off-state, and switch SW2 is set to the on-state at the time of the read operation.

FIG. 18 is a view showing a simulation result at the time of the read operation of a comparative example. That is, FIG. 18 is a view showing a simulation result at the time when both the switch SW1 and switch SW2 are set to the on-state at the time of the read operation.

In each of FIG. 17 and FIG. 18, (a) indicates a pre-charge period, and (b) indicates a discharge period. Further, (c) indicates potentials of the global word line GWL and global bit line GBL, and (d) indicates the current flowing through the memory cell MC.

Further, in each of FIG. 17 and FIG. 18, (c) and (d), each of r1, r2, and r3 indicates a ratio of the distance d1 between the desired memory cell MC and desired switch SW1 to the distance d2 between the desired memory cell MC and desired switch SW2. More specifically, r1, r2, and r3 indicate the following ratios.

r1=d1:d2=0:1 r2=d1:d2=0.2:0.8 r3=d1:d2=0.5:0.5

As can be seen from FIG. 17 and FIG. 18, in the case of this embodiment (FIG. 17(d)), the peak current is smaller as compared with the case of the comparative example (FIG. 18(d)). On the other hand, although in the case of this embodiment (FIG. 17(c)), the discharge rate is lower as compared with the case of the comparative example (FIG. 18(c)), by carrying out the switch control as shown in FIG. 12 or FIG. 13, it is possible to make the discharge rate higher.

Next, a modified example of the read operation of the memory device according to this embodiment will be described below. It should be noted that the fundamental items are identical to the above-mentioned embodiment, and hence descriptions of the items already described in the above-mentioned embodiment will be omitted.

In this modified example, the determination object resistive state is determined by comparing the determination object voltage with a predetermined reference voltage by means of the determination circuit.

FIG. 19 is a block diagram showing the functional configuration of a determination circuit 50 of this modified example.

In this modified example, a predetermined reference voltage is held in a voltage holding section 51. The reference voltage is greater than the hold voltage Vholdl shown in FIG. 7 and is less than the hold voltage Vholdh. That is, the reference voltage is greater than the hold voltage Vholdl applied between the word line WL and bit line BL when the selector 102 makes a transition from the on-state to the off-state in the case where the magnetoresistance effect element 101 is set to the low-resistance state, and is less than the hold voltage Vholdh applied between the word line WL and bit line BL when the selector 102 makes a transition from the on-state to the off-state in the case where the magnetoresistance effect element 101 is set to the high-resistance state.

The acquiring operation for acquiring the determination object voltage is identical to the first read operations shown in FIGS. 9A to 9E. By carrying out the read operations shown in FIGS. 9A to 9E in the same manner as the above-described embodiment, the hold voltage Vhold applied between the word line WL and bit line BL, i.e., the hold voltage Vhold applied between the both ends of the memory cell MC is acquired. The acquired hold voltage Vhold is held in the voltage holding section 51 as the determination object voltage.

The determination object voltage held in the voltage holding section 51 is compared with the predetermined reference voltage in the comparing section 53. That is, comparison is carried out by the comparing section 53 as to whether the determination object voltage is greater than the reference voltage or is less than the reference voltage. In the determining section 54, the determination object resistive state of the magnetoresistance effect element 101 is determined on the basis of the comparison result obtained by the comparing section 53. More specifically, when the determination object voltage is less than the reference voltage, it is determined that the determination object resistive state is the low-resistance state and, when the determination object voltage is greater than the reference voltage, it is determined that the determination object resistive state is the high-resistance state.

As described above, in this modified example too, read operations identical to the above-described embodiment are carried out, and hence, as in the case of the above-described embodiment, it is possible to suppress the peak current occurring when the selector 102 makes a transition from the off-state to the on-state.

Further, in this modified example too, the determination object voltage is acquired in the manner identical to the above-described embodiment, and hence, as in the case of the above-described embodiment, it is possible to prevent the problem that the applied voltage of the memory cell MC oscillates, and the like from occurring, and carry out a stable read operation.

It should be noted that although in the above-described embodiment, the magnetoresistance effect element 101 is used as the resistance change memory element, it is also possible to use a different type of resistance change memory element, so long as it is an element configured to store data therein on the basis of the resistive state (low-resistance state, high-resistance state), such as a phase-change memory element (PCM element), and the like.

Further, although in the above-described embodiment, as the selector (switching element) 102, the switching element having the current-voltage characteristics as shown in FIG. 5 is used, a two-terminal type switching element having the ordinary diode characteristics may also be used and, furthermore, a three-terminal type switching element such as a transistor or the like may also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a plurality of first wiring lines each extending in a first direction;
a plurality of second wiring lines each extending in a second direction intersecting the first direction;
a plurality of memory cells each connected between a corresponding first wiring line and a corresponding second wiring line, and each including a resistance change memory element capable of being set to a low-resistance state and a high-resistance state and a switching element connected in series to the resistance change memory element;
a first common wiring line provided for the first wiring lines;
a second common wiring line provided for the second wiring lines;
a first selecting circuit interposed between first ends of the first wiring lines and the first common wiring line; and
a second selecting circuit interposed between second ends of the first wiring lines and the first common wiring line, wherein:
at a time of accessing a desired memory cell connected between a desired first wiring line and a desired second wiring line, when a path between the desired first wiring line and the first common wiring line through the first selecting circuit is defined as a first path, and a path between the desired first wiring line and the first common wiring line through the second selecting circuit is defined as a second path, during a first access period including a time point at which the switching element included in the desired memory cell makes a transition from an off-state to an on-state, one of the first path and the second path is set to an electrically conductive state and the other one of the first path and the second path is set to an electrically nonconductive state.

2. The device of claim 1, wherein:
of the first path and the second path, a path longer from the desired memory cell is set to the conductive state and a path shorter from the desired memory cell is set to the nonconductive state.

3. The device of claim 1, wherein:
the first selecting circuit includes a plurality of first switches each connected to a respective one of the first ends of the first wiring lines, and the second selecting circuit includes a plurality of second switches each connected to a respective one of the second ends of the first wiring lines, and
during the first access period, one of a desired first switch and a desired second switch each connected to the desired first wiring line is set to an on-state and the other of the desired first switch and the desired second switch is set to an off-state, whereby one of the first path and the second path is set to the electrically conductive state and the other of the first path and the second path is set to the electrically nonconductive state.

4. The device of claim 1, wherein:
during the first access period, a read voltage is applied between the desired first wiring line and the desired second wiring line, whereby the switching element included in the desired memory cell is set to an on-state, and a resistive state set to the resistance change memory element included in the desired memory cell is read through the one of the first path and the second path.

5. The device of claim 1, wherein:
the switching element is structured such that when a voltage applied between two terminals thereof increases to reach a first voltage, the switching element makes a transition from an off-state to an on-state and, when a voltage applied between the two terminals thereof decreases to reach a second voltage lower than the first voltage, the switching element makes a transition from the on-state to the off-state.

6. The device of claim 5, further comprising a determination circuit which determines a determination object resistive state set in advance to the resistance change memory element included in the desired memory cell, wherein
the determination circuit determines the determination object resistive state based on a determination object voltage applied between the desired first wiring line and the desired second wiring line when the switching element included in the desired memory cell makes a transition from the on-state to the off-state.

7. The device of claim 6, wherein:
when the determination circuit acquires the determination object voltage, the desired second wiring line is maintained in a floating state,
before the determination circuit acquires the determination object voltage, a voltage higher than a predetermined threshold voltage is applied between the desired first wiring line and the desired second wiring line in a state where the desired second wiring line is maintained in the floating state, whereby the switching element included in the desired memory cell makes a transition from the off-state to the on-state, and
after the switching element included in the desired memory cell makes a transition from the off-state to the on-state, the voltage applied between the desired first wiring line and the desired second wiring line decreases to the determination object voltage.

8. The device of claim 6, wherein:
after the determination object voltage is acquired, one of the low-resistance state and the high-resistance state is set to the resistance change memory element included in the desired memory cell as a reference resistive state, and
the determination circuit acquires, as a reference voltage, a voltage applied between the desired first wiring line and the desired second wiring line when the switching element included in the desired memory cell makes a transition from the on-state to the off-state in a state where the reference resistive state is set to the resistance change memory element included in the desired memory cell, and determines the determination object resistive state based on the determination object voltage and the reference voltage.

9. The device of claim 8, wherein:
the determination circuit compares a voltage difference between the determination object voltage and the reference voltage with a criterion voltage difference and, when the voltage difference is less than the criterion voltage difference, determines that the determination object resistive state is a resistive state identical to the reference resistive state.

10. The device of claim 6, wherein:

the determination circuit compares the determination object voltage with a reference voltage and, when the determination object voltage is less than the reference voltage, determines that the determination object resistive state is the low-resistance state and, when the determination object voltage is greater than the reference voltage, determines that the determination object resistive state is the high-resistance state.

11. The device of claim 10, wherein:

the reference voltage is greater than a voltage applied between the desired first wiring line and the desired second wiring line when the switching element included in the desired memory cell makes a transition from the on-state to the off-state in a case where the resistance change memory element included in the desired memory cell is set to the low-resistance state, and is less than a voltage applied between the desired first wiring line and the desired second wiring line when the switching element included in the desired memory cell makes a transition from the on-state to the off-state in a case where the resistance change memory element included in the desired memory cell is set to the high-resistance state.

12. The device of claim 1, wherein:

during the first access period, a write voltage is applied between the desired first wiring line and the desired second wiring line, whereby the switching element included in the desired memory cell is set to an on-state, and one of the low-resistance state and the high-resistance state is written to the resistance change memory element included in the desired memory cell through one of the first path and the second path.

13. The device of claim 1, wherein:

during a second access period after the first access period, both the first path and the second path are set to the electrically conductive state.

14. The device of claim 1, further comprising a third selecting circuit interposed between first ends of the second wiring lines and the second common wiring line, wherein:

during a third access period including a time point at which the switching element included in the desired memory cell makes a transition from an off-state to an on-state, a third path between a desired second wiring line and the second common wiring line through the third selecting circuit is set to the electrically nonconductive state.

15. The device of claim 1, wherein:

the resistance change memory element is a magnetoresistance effect element.

* * * * *